(12) United States Patent
Jeong

(10) Patent No.: US 6,519,181 B2
(45) Date of Patent: Feb. 11, 2003

(54) FLASH MEMORY DEVICE

(75) Inventor: Weon-Hwa Jeong, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/028,761

(22) Filed: Dec. 28, 2001

(65) Prior Publication Data

US 2002/0091906 A1 Jul. 11, 2002

(30) Foreign Application Priority Data

Dec. 29, 2000 (KR) ........................................ 2000-85151

(51) Int. Cl.[7] .............................................. G11C 16/00
(52) U.S. Cl. .............................. 365/185.11; 365/185.18; 365/185.23
(58) Field of Search .................. 365/185.11, 185.18, 365/185.29, 185.33, 185.23

(56) References Cited

U.S. PATENT DOCUMENTS 5,886,923 A  * 3/1999 Hung .................... 365/185.11
5,898,606 A  * 4/1999 Kobayashi et al. .... 365/185.11

* cited by examiner

Primary Examiner—Tan T. Nguyen
(74) Attorney, Agent, or Firm—Birch, Stewart, Kolasch & Birch, LLP

(57) ABSTRACT

A flash memory device capable of compensating the decrease of a threshold voltage of an unselected cell due to the drain coupling caused by a drain voltage supplied to a bit line of a selected cell is disclosed. The flash memory device provides a ground voltage to a source line of the selected cell while supplying a preset voltage to a source line of the unselected cell. The flash memory device employs a decoding unit for supplying a program voltage to a word line selected from a cell array based on a global word line signal, a local word line signal and a predecoder signal. The decoding unit also provides a ground voltage to a source line corresponding to the selected word line in response to a sector program signal and an inverted sector program signal and inputs a preset voltage higher than the ground voltage to source lines of unselected cells.

14 Claims, 5 Drawing Sheets

FLASH MEMORY DEVICE

CROSS-REFERENCES TO RELATED APPLICATIONS

This nonprovisional application claims priority under 35 U.S.C. §119(a) on Patent Application No. 2000-85151 filed in the Republic of Korea on Dec. 29, 2000, the entirety of which is herein incorporated by reference.

BACKGROUND OF THE INVENTION

1. Field of the Invention

The present invention relates to a semiconductor device, and more particularly to a flash memory device for increasing a threshold voltage of an unselected cell by providing a ground voltage to a source line of a selected cell and supplying a preset voltage to a source line of the unselected cell. The present invention thereby compensates a decrease of the threshold voltage of the unselected cell due to a drain coupling caused by a drain voltage supplied to a bit line of the selected cell.

2. Description of the Background Art

FIGS. 1A–1B are schematic views of a flash memory device of the background art. FIG. 2 is an operational timing diagram of the conventional flash memory device shown in FIGS. 1A–1B. Referring to FIG. 1A, a conventional flash memory device includes a NOR-type flash memory cell array 10, a decoding unit for controlling word lines of cells in the cell array 10 and a multiplexor 30 for controlling bit lines and source lines of the cells.

As shown in FIG. 1A, the decoding unit includes a plurality of decoding blocks 20__1 to 20__j according to predecoder signals XPREA and XPREB inputted thereto, each decoding block having an identical configuration with each other. For example, the first decoding block 20__1 includes a multiplicity of decoding circuits 21__1 to 21__i and each decoding circuit is provided with a first supply voltage VPPX of a positive high voltage, a reset signal XRST and a second supply voltage VEEX of a negative high voltage.

Referring to FIG. 1B, a second decoding circuit 21__2 of the decoding block 20__1 is shown in detail. Since the configuration and the operation of the second decoding circuit 21__2 are identical to those of other decoding circuits in the decoding blocks 20__1 to 20__j, only the operation and configuration of the second decoding circuit 21__2 shown in FIG. 1B will be described hereinafter. It will be understood that the operation and configuration of the remaining decoding circuits will be the same as that described for the second decoding circuit 21__2 which is coupled with a first predecoder signal XPREA1.

As described in FIG. 1B, a first PMOS transistor P11 is connected between a third supply voltage node Vcc and a first node Q11 and is driven in response to the reset signal XRST. A first NMOS transistor N11, a fourth NMOS transistor N14 and a fifth NMOS transistor N15 are connected in series between the first node Q11 and a ground node Vss. The fourth and the fifth NMOS transistors N14, N15, respectively, operate in response to a second predecoder signal XPREB0 and a sector signal SECTOR, respectively.

The fourth NMOS transistor N14 is commonly connected to all of the decoding circuits 21__1 to 21__i in the decoding block 20__1 and the fifth NMOS transistor N15 is commonly attached to all of the decoding blocks 20__1 to 20__j. Further, a second PMOS transistor P12 is located between a first supply voltage node VPPX and a second node Q12 and operates in response to the potential of an output node WL1. A third PMOS transistor P13 is attached between the first supply voltage node VPPX and the output node WL1 and operates in response to the potential of the second node Q12.

A second NMOS transistor N12 is connected between the first node Q11 and the second node Q12 and always maintains a turned-on state since its gate is attached to the third supply voltage node Vcc. Finally, a third NMOS transistor N13 being a triple NMOS transistor is positioned between the output node WL1 and the second supply voltage node VEEX and its gate is connected to the first node Q11.

The flash memory device shown in FIG. 1A includes the multiplexor 30 that is separated into two parts, e.g., a first part for controlling the bit lines of the cells and a second part for controlling the source lines of the cells. The second part employs NMOS transistors positioned between the source lines, e.g., Source0 and Sourcek, and the ground node Vss, and operating in response to a source control signal SOCTRL.

An operational timing diagram of the conventional flash memory device shown in FIGS. 1A–1B is shown in FIG. 2. A method for programming the conventional flash memory device will be explained hereinafter with reference to the accompanying drawings.

If a program instruction, a program address and program data are inputted to the conventional flash memory device, the reset signal XRST is transited from a low state to a high state and the first predecoder signal XPREA1. The second predecoder signal XPREB0 and the sector signal SECTOR, which are selected by the program address, are also transited from a low state to a high state. Accordingly, the first PMOS transistor P11 is turned off in response to the reset signal XRST of the high state. In response to the second predecoder signal XPREB0 and the sector signal SECTOR having the high state, the fourth and the fifth NMOS transistors N14 and N15 are turned on. The potential of the first node Q11 is passed to the ground node Vss and the first node Q11 thus maintains a low state. Subsequently, in response to the potential of the first node Q11 maintaining the low state, the third NMOS transistor N13 is turned off and the second node Q12 also has a low state.

The third POMS transistor P13 is turned on in response to the potential of the second node Q12 having the low state and, the first supply voltage VPPX is thus provided to the output node WL1. Since the potential of the output node WL1 maintains the high voltage VPPX, the second PMOS transistor P12 is turned off. The first supply voltage VPPX, which is provided to the output node WL1 by a gate pump, ascends to a program voltage of about 9 V. At the same time, a bit line selected by the program address is transited from a low state to the program voltage by a drain pump. Accordingly, a programming operation for a selected cell A is executed. The source lines of all of the cells therefore maintain the ground potential Vss since the sixth and the seventh NMOS transistor N16 and N17 are turned on in response to the source control signal SOCTRL.

However, in the case of the conventional flash memory device performing the programming operation as described above, as a drain voltage of a cell ascends to the program voltage 5 V, a threshold voltage of an unselected cell decreases by the coupling with the drain voltage. As a result, a leakage current of the unselected cell increases and the required current for programming the selected cell is about twice that of a pure program current. This results in substantially increasing the size of the drain pump providing a current to the bit line of the selected cell. Further, as the bit line current of the selected cell increases, the drain voltage of the selected cell substantially decreases, and programming speed for a cell is diminished.

SUMMARY OF THE INVENTION

The present invention overcomes the shortcomings associated with the background art and achieves other advantages not realized by the background art.

An object of the present invention is to provide a flash memory device for increasing a threshold voltage of an unselected cell by providing a ground voltage to a source line of a selected cell and supplying a preset voltage to a source line of the unselected cell. The decrease of the threshold voltage of the unselected cell due to the drain coupling caused by a drain voltage supplied to a bit line of the selected cell is thereby compensated.

These and other objects are accomplished by a flash memory device comprising a flash memory cell array including a plurality of cellblocks, each cellblock having a multiplicity of cells; a multiplexor, the multiplexor selecting a bit line among a plurality of bit lines of the cell array; and decoding means, the decoding means supplying a program voltage to a word line selected among a plurality of word lines of the cell array based on a global word line signal, a local word line signal and a predecoder signal, providing a ground voltage to a source line of a cellblock including the selected word line in response to a sector program signal and an inverted sector program signal, and inputting a preset voltage higher than the ground voltage to source lines of unselected cellblocks.

These and other objects are further accomplished by a method of programming a flash memory device having a flash memory cell array including a plurality of cellblocks, each cellblock having a multiplicity of cells, a multiplexor, wherein the multiplexor selects a bit line among a plurality of bit lines of the cell array; and a decoding unit, the method comprising the steps of supplying a program voltage to a word line selected among a plurality of word lines of the cell array based on a global word line signal, a local word line signal and a predecoder signal, providing a ground voltage to a source line of a cellblock including the selected word line in response to a sector program signal and an inverted sector program signal, and inputting a preset voltage higher than the ground voltage to a plurality of source lines of unselected cellblocks.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. dr

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

Figure 1A:
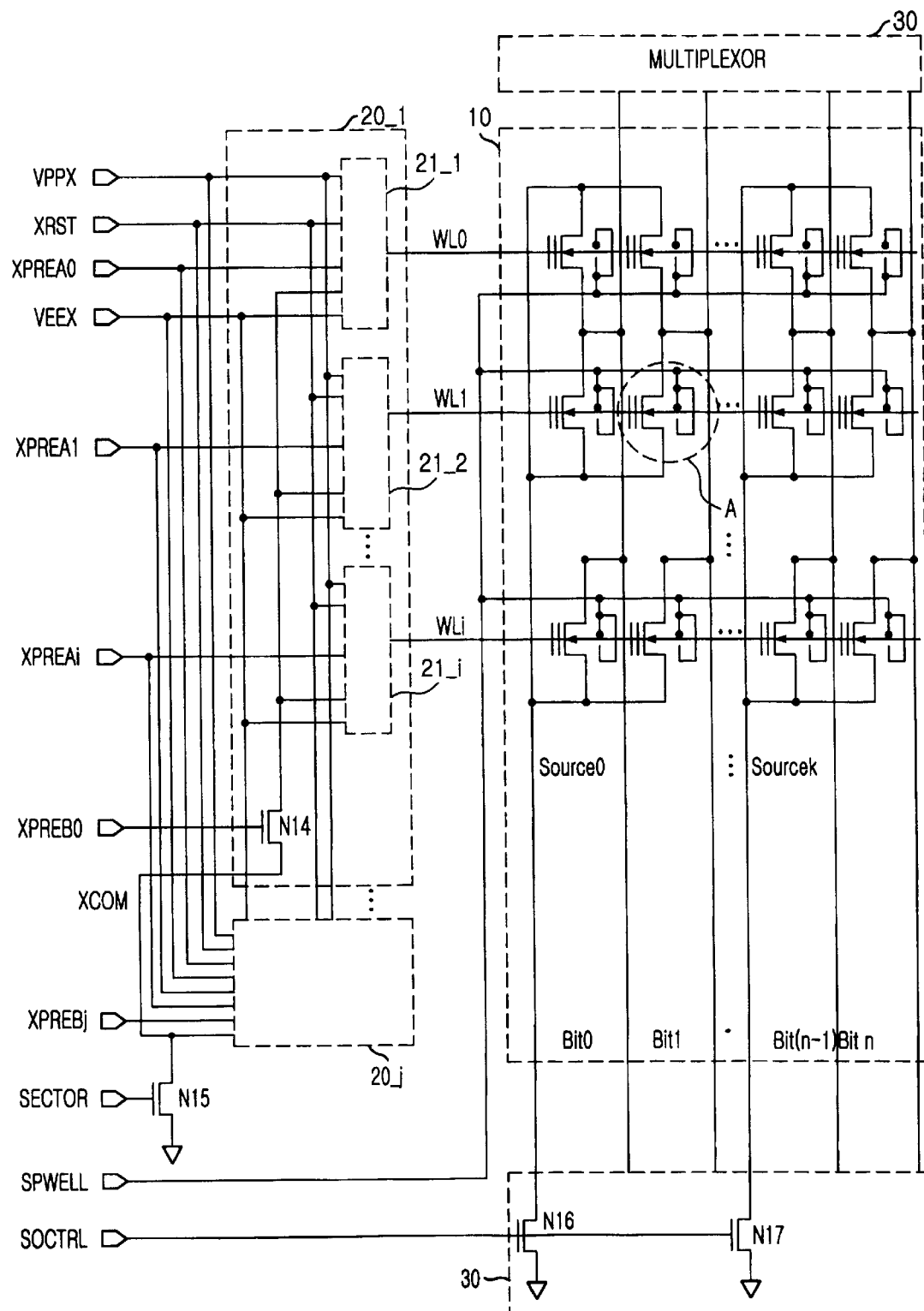
FIG. 1A is a schematic view of a flash memory device of the background art.
Figure 1B:
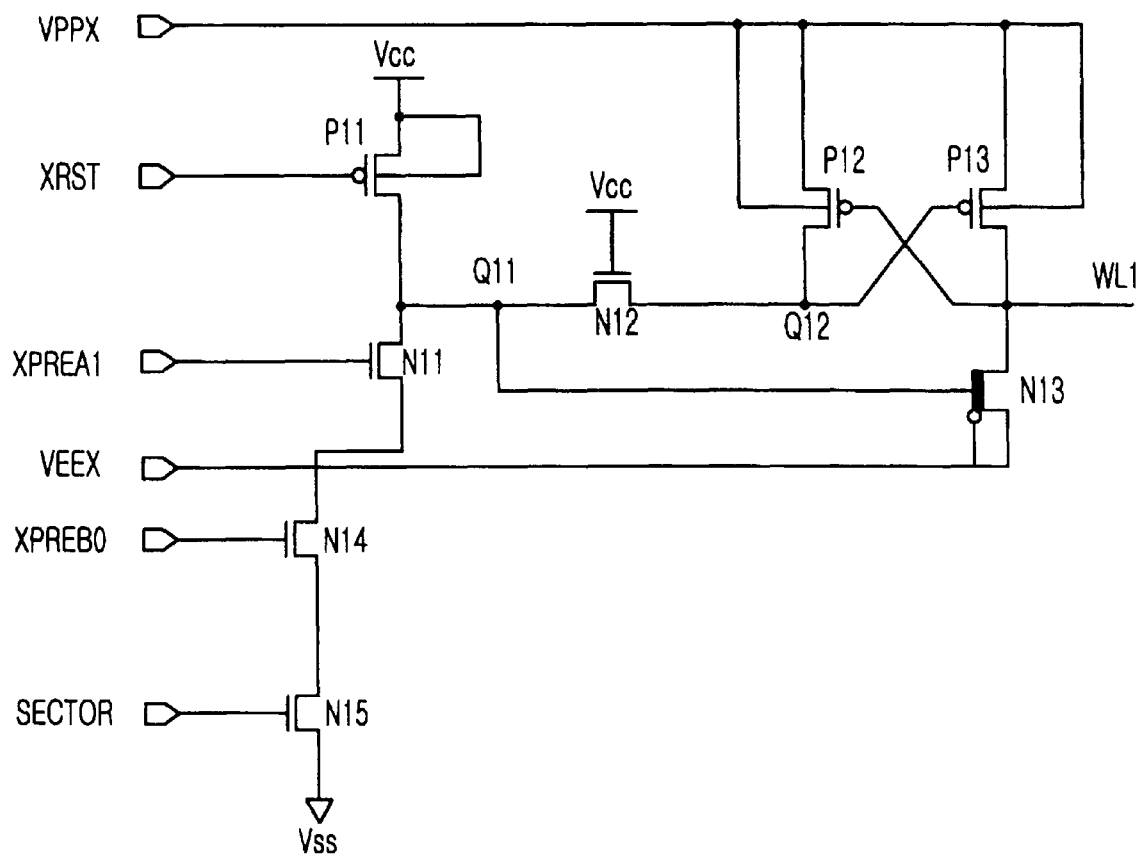
FIG. 1B is a schematic view of a flash memory device of the background art.
Figure 2:
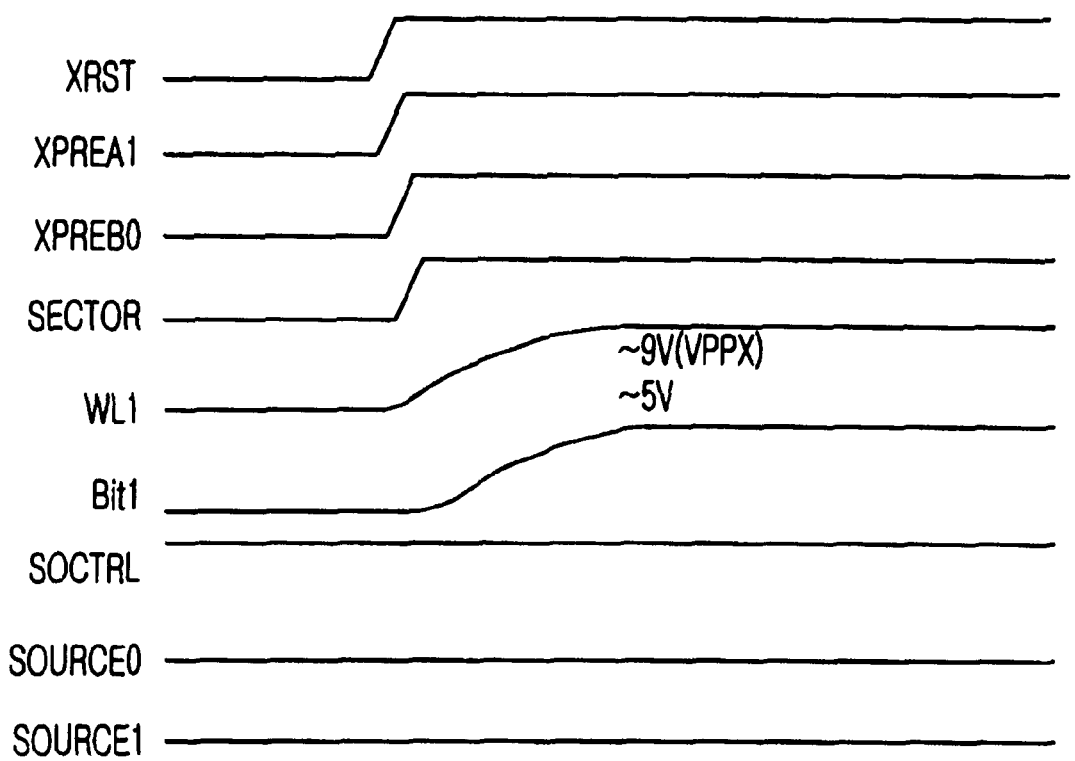
FIG. 2 is an operational timing diagram of the conventional flash memory device shown in FIGS. 1A–1B.
Figure 3:
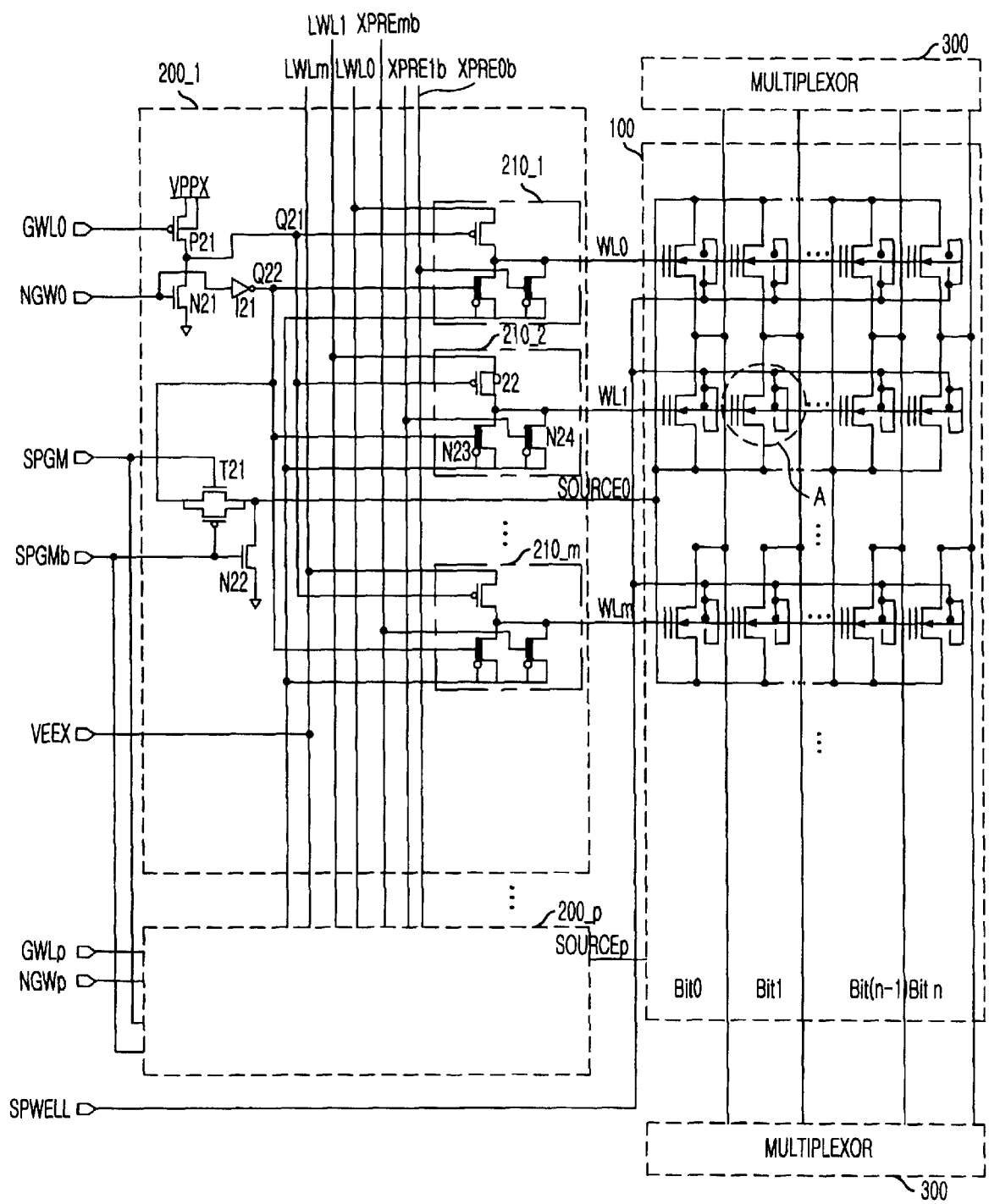
FIG. 3 is a schematic view of a flash memory device according to an embodiment of the present invention.
Figure 4:
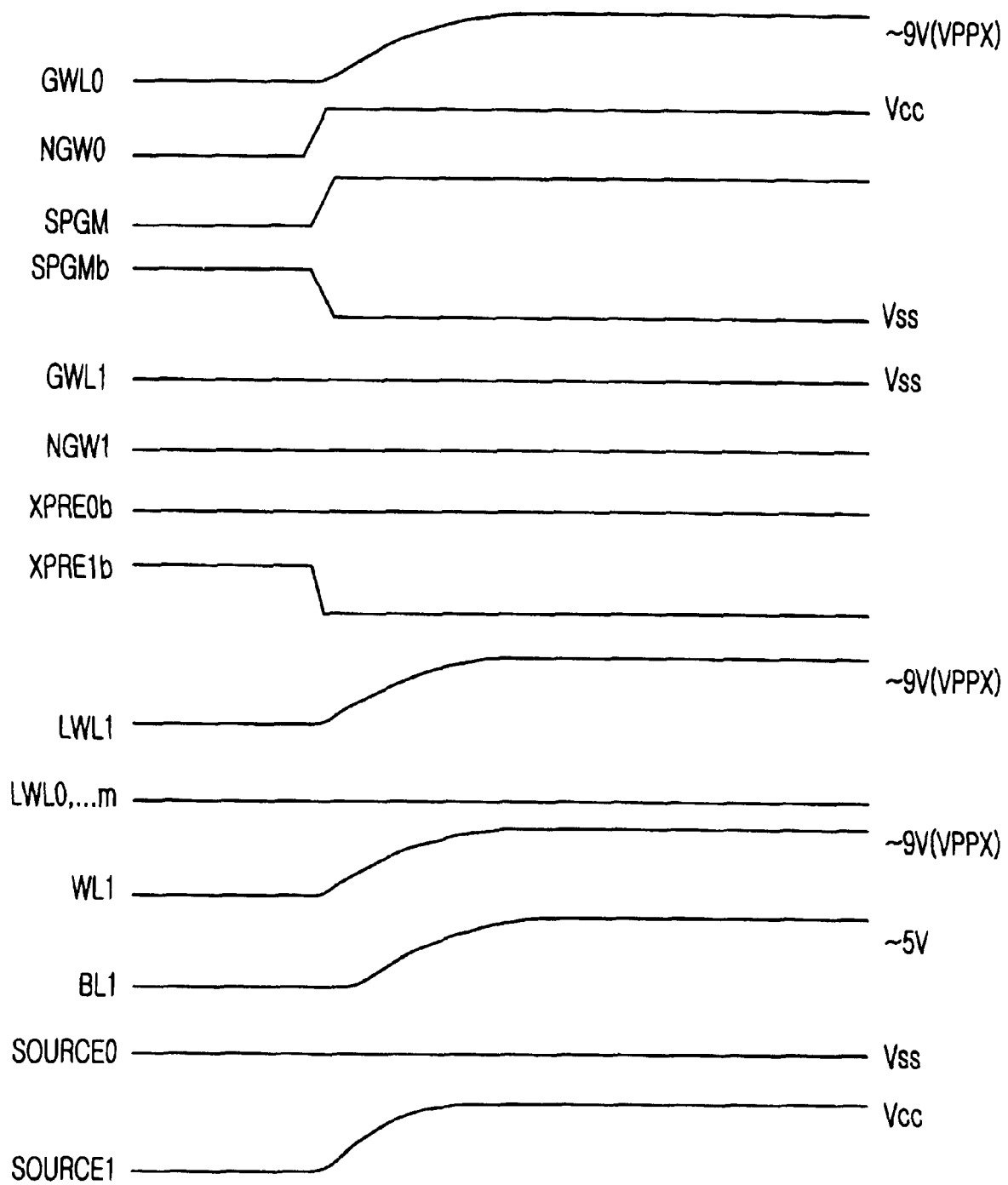
FIG. 4 is an operational timing diagram of the flash memory device shown in FIG. 3.

The present invention will hereinafter be described with reference to the accompanying drawings. FIG. 3 is a schematic view of a flash memory device according to an embodiment of the present invention. FIG. 4 is an operational timing diagram of the flash memory device shown in FIG. 3.

Referring to FIG. 3, a flash memory device in accordance with the present invention includes a NOR-type flash memory cell array 100, a decoding unit for controlling word lines and source lines of the cells in the cell array 100, and a multiplexor 300 for controlling bit lines of the cells. The cell array 100 can be classified into a plurality of cellblocks according to a global word line signal GWLi, each cellblock including a multiplicity of cells. The decoding unit includes a multiplicity of decoding blocks 200_1 to 200_p according to a global word line signal GWLi, i being 0 to p. Each decoding block 200_1 to 200_p includes a plurality of decoding circuits, e.g., 210_1 to 210_m, according to a local word line signal LWLj, j being 0 to m.

The operation and configuration of a circuit commonly connected to the decoding circuits 210_1 to 210_m and a decoding circuit 210_2 operating in response to a first global word line GWL0 and a second local word line signal LWL1, will be described hereinafter. In the commonly connected circuit, a first PMOS transistor P21, provided with the first global word line signal GWL0, is connected to a first node Q21 and VPPX (approximately 9V during a program operation). A first NMOS transistor N21 is connected between the first node Q21 and a ground node Vss, and operates in response to a first control signal NGW0. An inverter 121 is attached between an input node of the first control signal NGW0 and a second node Q22.

A first transmission gate T21, which operates in response to a sector program signal SPGM and an inverted sector program signal SPGMb, supplies the potential of the second node Q22 to a first source line SOURCE0. A second NMOS transistor N22 is connected between the first source line SOURCE0 and the ground node Vss, and operates in response to the inverted sector program signal SPGMb.

In the decoding circuit 210_2, a second PMOS transistor P22 positioned between an input node of the second local word line signal LWL1 and a second word line WL1 is driven according to the potential of the first node Q21. A third NMOS transistor N23, connected between the second word line WL1 and the second supply voltage node VEEX, operates in response to the potential of the second node Q22. A fourth NMOS transistor N24 attached between the second word line WL1 and the second supply voltage node VEEX is driven under the control of a predecoder signal XPRE1b.

A method for programming the flash memory device in accordance with the present invention will be described hereinafter with reference to FIG. 4 showing an operational timing diagram of the flash memory device. According to a program address for a selected cell, the first global word line signal GWL0 and the second local word line signal LWL1 are inputted to the flash memory device. The sector program signal SPGM for a selected sector including the selected cell and the inverted sector program signal SPGMb are coupled to the flash memory device. Meanwhile, the predecoder signal XPRE1b for the selected second local word line signal LWL1 is also provided.

In order to perform a programming operation, a high voltage of about 9 V is supplied through the first global word line signal GWL0 and the second local word line signal LWL1. The first control signal NGW0 is inputted in a high state, and the sector program signal SPGM and the inverted sector program signal SPGMb are provided in a high state and a low state, respectively.

The first PMOS transistor P21 is turned off in response to the first global word line GWL0 having the high state and the first NMOS transistor N21 is turned on by the first control signal NGW0 having the high state. Accordingly, the first node Q21 maintains the potential of a low state.

In the meantime, the high state of the first control signal NGW0 is transited to a low state by the inverter I21 and, the second node Q22 thus maintains the potential of a low state. In response to the potential of the first node Q21 maintaining the low state, the second PMOS transistor P22 is turned on. At this time, the third NMOS transistor N23 is turned off in response to the potential of the second node Q22 having the low state, and the fourth NMOS transistor N24 is turned off by the inverted predecoder signal XPRE1b having the low state. Consequently, the high voltage of the second local word line signal LWL1 is provided to the second word line WL1.

The first transmission gate T21 is turned on in response to the sector program signal SPGM having a high state and the inverted sector program signal SPGMb having a low state. The second NMOS transistor N22 is also turned off in response to the inverted sector program signal SPGMb having the low state. As a result, the potential of the second node Q22 maintaining the low state is provided through the first source line SOURCE0 to source nodes of memory cells in a first cellblock selected by the first global word line signal GWL0. On the other hand, unselected source lines are provided with the supply voltage Vcc. Accordingly, a bit line of the cell selected by the program address is enabled and a program voltage supplied by a drain pump is provided to a drain of the selected cell through the enabled bit line so that the selected cell is programmed.

As described hereinabove, in accordance with the present invention, by supplying the ground voltage to the source line of the selected cell and a voltage of approximately 2 V to the source lines of the unselected cells, the threshold voltage of the unselected cells increases and it is possible to compensate the decrease of the threshold voltage of the unselected cells due to the drain coupling caused by the drain voltage supplied to the bit line of the selected cell.

Therefore, the bit line current of the selected cell becomes almost identical to the program current of the selected cell and the size of the drain pump becomes smaller than that of the conventional pumps of the background art. Accordingly, the present invention results in decreasing chip size. Further, by decreasing the bit line current of the selected cell, the voltage drop at the bit line of the selected cell decreases, and the program speed of the selected cell can be enhanced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A flash memory device comprising:
    a flash memory cell array including a plurality of cellblocks, each cellblock having a multiplicity of cells;
    a multiplexor, said multiplexor selecting a bit line among a plurality of bit lines of the cell array; and
    decoding means, said decoding means
        supplying a program voltage to a word line selected among a plurality of word lines of the cell array based on a global word line signal, a local word line signal and a predecoder signal,
        providing a ground voltage to a source line of a cellblock including the selected word line in response to a sector program signal and an inverted sector program signal, and
        inputting a preset voltage higher than the ground voltage to source lines of unselected cellblocks.
2. The flash memory device according to claim 1, said decoding means including a plurality of decoding blocks, wherein each decoding block has a multiplicity of decoding circuits.
3. The flash memory device according to claim 2, wherein a number of the decoding blocks equals a number of the cellblocks.
4. The flash memory device according to claim 3, said decoding means further including:
    switching means for adjusting the potential of a first node in response to the global word line signal and a first control signal;
    means for selecting the word line based on the predecoder signal and the potential of the first node and providing the local word line signal to the word line;
    means for inverting the first control signal; and a transmission gate for providing an output signal of said means for inverting to the source line of the cellblock in response to the sector program signal and the inverted sector program signal.
5. The flash memory device according to claim 1, said decoding means further including means for switching and adjusting the potential of a first node in response to the global word line signal and a first control signal.
6. The flash memory device according to claim 5, said decoding means further including means for selecting the word line based on the predecoder signal and the potential of the first node and providing the local word line signal to the word line.
7. The flash memory device according to claim 5, said decoding means further including means for inverting the first control signal.
8. The flash memory device according to claim 7, said decoding means further including a transmission gate for providing an output signal of the inverting means to the source line of the cellblock in response to the sector program signal and the inverted sector program signal.
9. The flash memory device according to claim 1, said decoding means further including:
    switching means for adjusting the potential of a first node in response to the global word line signal and a first control signal;
    means for selecting the word line based on the predecoder signal and the potential of the first node and providing the local word line signal to the word line;
    means for inverting the first control signal; and
    a transmission gate for providing an output signal of said means for inverting to the source line of the cellblock in response to the sector program signal and the inverted sector program signal.

10. The flash memory device according to claim 9, said word line selecting means further including:

first switching means for transferring the local word line signal to the selected word line in response to the potential of the first node, second switching means for adjusting the potential of the selected word line according to the output signal of the inverting means, and third switching means for controlling the potential of the selected word line depending on the predecoder signal.

11. A method of programming a flash memory device having a flash memory cell array including a plurality of cellblocks, each cellblock having a multiplicity of cells, a multiplexor, wherein said multiplexor selects a bit line among a plurality of bit lines of the cell array; and a decoding unit, said method comprising the steps of:

supplying a program voltage to a word line selected among a plurality of word lines of the cell array based on a global word line signal, a local word line signal and a predecoder signal, providing a ground voltage to a source line of a cellblock including the selected word line in response to a sector program signal and an inverted sector program signal, and inputting a preset voltage higher than the ground voltage to a plurality of source lines of unselected cellblocks.

12. The method according to claim 11, wherein a high voltage of about 9 V is supplied through the first global word line signal and the local word line signal.

13. The method according to claim 12, wherein a voltage of approximately 2 V is supplied to the source lines of the unselected cells.

14. The method according to claim 11, wherein a voltage of approximately 2 V is supplied to the source lines of the unselected cells.

* * * * *